(12) United States Patent
Yang

(10) Patent No.: US 8,199,606 B2
(45) Date of Patent: Jun. 12, 2012

(54) SEMICONDUCTOR MEMORY APPARATUS AND METHOD OF CONTROLLING THE SAME

(75) Inventor: Sun Suk Yang, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 232 days.

(21) Appl. No.: 12/650,412

(22) Filed: Dec. 30, 2009

(65) Prior Publication Data

US 2010/0214865 A1  Aug. 26, 2010

(30) Foreign Application Priority Data

Feb. 25, 2009  (KR) ........................ 10-2009-0015829

(51) Int. Cl.
*G11C 8/00* (2006.01)
(52) U.S. Cl. ............ 365/230.08; 365/230.06; 365/233.1
(58) Field of Classification Search ............. 365/230.08, 365/230.06, 221, 233.1
See application file for complete search history.

(56) References Cited

U.S. PATENT DOCUMENTS

| 5,463,635 | A | 10/1995 | Kumazawa et al. |
| 5,787,045 | A | 7/1998 | Lee |
| 6,480,033 | B1 * | 11/2002 | Shinozaki .................... 326/105 |
| 6,532,184 | B2 * | 3/2003 | Chun ........................... 365/194 |
| 6,643,218 | B1 * | 11/2003 | Chun ....................... 365/233.12 |
| 6,906,976 | B2 * | 6/2005 | Kwean ......................... 365/222 |
| 2003/0126413 | A1 | 7/2003 | El-Kik et al. |
| 2005/0166097 | A1 | 7/2005 | An |

FOREIGN PATENT DOCUMENTS

| JP | 2000-057777 | 2/2000 |
| KR | 10-2002-0018944 A | 3/2002 |

\* cited by examiner

*Primary Examiner* — Gene Auduong
(74) *Attorney, Agent, or Firm* — William Park & Associates Ltd.

(57) ABSTRACT

A semiconductor memory apparatus includes: an address buffer configured to buffer an input address and generate a buffered address; a command buffer configured to buffer a chip selection command and generate a buffered command; a latch control unit configured to receive an internal clock and the buffered command and generate a latch control signal; and an address latch unit configured to latch the buffered address based on the latch control signal.

13 Claims, 2 Drawing Sheets

SEMICONDUCTOR MEMORY APPARATUS AND METHOD OF CONTROLLING THE SAME

CROSS-REFERENCE TO RELATED APPLICATION

The present application claims priority under 35 U.S.C. §119(a) to Korean Application No. 10-2009-0015829, filed on Feb. 25, 2009 with the Korean Intellectual Property Office, which is incorporated by reference in its entirety as if set forth in full.

RELATED ART OF THE INVENTION

1. Technical Field

Various embodiments of the present disclosure relate to a semiconductor memory apparatus, and more particularly, to an address input circuit of the semiconductor memory apparatus.

2. Related Art

In general, a semiconductor memory apparatus includes a plurality of input pins to receive signals such as a command, an address, data, and the like. The respective input pins are coupled to a buffer and a latch circuit, and the semiconductor memory apparatus buffers and latches the respective input signals by using such a circuit configuration. Among the signals inputted in such a manner, the address comprises a multi-bit digital signal, and is utilized to perform a function for designating a specific area in a memory cell. The semiconductor memory apparatus transfers the latched address to a core circuit region inside the semiconductor memory apparatus, based on an input of a chip selection command '/CS'.

As such, the semiconductor memory apparatus in the related art includes the input buffer and the latch circuit as a configuration for buffering and latching the input signal. Here, the latch circuit in the related art constantly performs the operation for latching the address, in synchronization with a clock signal even when the address is not substantially transferred to the internal core circuit region, i.e., the chip selection command '/CS' is not enabled. Accordingly, unnecessary current consumption is constantly consumed in the latch circuit, thereby making it difficult to realize low power consumption of the semiconductor memory apparatus. As such, the semiconductor memory apparatus in the related art has a difficulty in realizing a technology that substantially reduces the current consumption of the latch circuit.

SUMMARY OF THE INVENTION

The embodiments of the present invention include a semiconductor memory apparatus and a method of controlling the same, capable of substantially reducing unnecessary current consumption.

In one embodiment of the present invention, a semiconductor memory apparatus comprises: an address buffer configured to buffer an input address and generate a buffered address; a command buffer configured to buffer a chip selection command and generate a buffered command; a latch control unit configured to receive an internal clock signal and the buffered command and generate a latch control signal; and an address latch unit configured to latch the buffered address based on the latch control signal.

In another embodiment of the present invention, a semiconductor memory apparatus comprises: a circuit unit configured to buffer and latch an input address to generate a latched address and transfer the latched address to a core circuit region when a chip selection command is enabled, and not to generate the latched address when the chip selection command is not enabled.

In still another embodiment of the present invention, a method of controlling a semiconductor memory apparatus comprises: detecting a disable state of a chip selection command to disable a latch control signal; disabling a latch operation on a buffered address based on the disabled latch control signal; detecting an enable state of the chip selection command to enable the latch control signal; and enabling the latch operation on the buffered address based on the enabled latch control signal.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus and a method of controlling the same, according to the present invention, will be described below with reference to the accompanying drawings through preferred embodiments.

Figure 1:
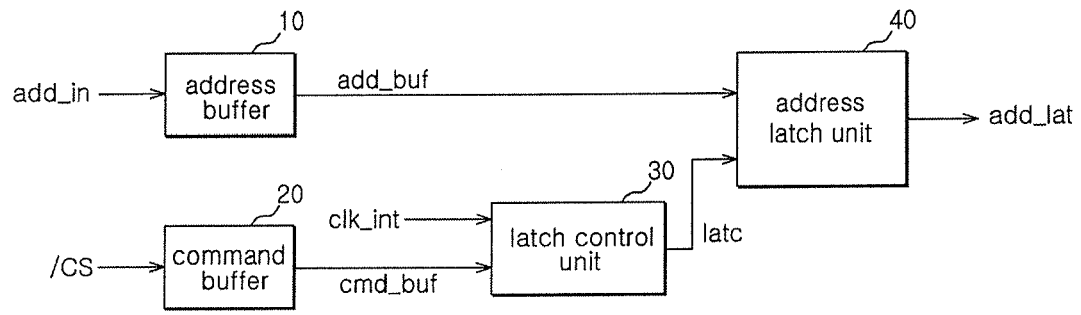
FIG. 1 is a block diagram schematically showing a configuration of a semiconductor memory apparatus according to an embodiment of the present invention.

FIG. 1 is a block diagram schematically showing a configuration of a semiconductor memory apparatus according to an embodiment.

As shown in FIG. 1, the semiconductor memory apparatus 1 according to the embodiment includes an address buffer 10, a command buffer 20, a latch control unit 30, and an address latch unit 40. The address buffer 10 buffers an input address 'add_in' to generate a buffered address 'add_buf'. The command buffer 20 buffers a chip selection command '/CS' to generate a buffered command 'cmd_buf'. The latch control unit 30 combines an internal clock signal 'clk_int' and the buffered command 'cmd_buf' to generate a latch control signal 'latc'. The address latch unit 40 latches the buffered address 'add_buf' to generate a latched address 'add_lat', in response to the latch control signal 'latc'.

The input address 'add_in' inputted to the address buffer 10 is implemented as a multi-bit digital signal, and the address buffer 10 sequentially buffers each bit of the input address 'add_in' inputted in serial to generate the buffered address 'add_buf'.

The command buffer 20 buffers the chip selection command '/CS' to generate the buffered command 'cmd_buf', and transfers the buffered command 'cmd_buf' to other latch circuits as well as the latch control unit 30. Here, a configuration for latching the buffered command 'cmd_buf' is not shown for convenience of description.

If the chip selection command '/CS' is disabled, the buffered command 'cmd_buf' is disabled as well, and in this case, the latch control unit 30 disables the latch control signal 'latc'. On the other hand, if the chip selection command '/CS' is enabled, the buffered command 'cmd_buf' is enabled as well, and in this case, the latch control unit 30 combines the internal clock signal 'clk_int' and the buffered command 'cmd_buf' to enable the latch control signal 'latc'. Here, the latch control signal 'latc' is implemented in a pulse signal form which has an enable interval with a substantially same duration as a high level interval of the internal clock signal 'clk_int'.

The address latch unit 40 latches the buffered address 'add_buf' in synchronization with the latch control signal 'latc' to generate the latched address 'add_lat'. However, during the disable interval of the latch control signal 'latc', the address latch unit 40 is disabled and thus does not perform the latch operation on the buffered address 'add_buf' which is transferred during the disable interval thereof.

That is, if the disable state of the chip selection command '/CS' is detected, the semiconductor memory apparatus 1 disables the latch control signal 'latc', and disables the latch operation on the buffered address 'add_buf' in response to the disabled latch control signal 'latc'. Accordingly, during the interval when the input address 'add_in' does not need to be transferred to the core circuit region via the address buffer 10 and the address latch unit 40 as the latched address 'add_lat', unnecessary current consumption of the address latch unit 40 is substantially prevented or reduced.

However, afterwards, if the enable state of the chip selection command '/CS' is detected, the semiconductor memory apparatus 1 enables the latch control signal 'latc', and enables the latch operation on the buffered address 'add_buf' to generate the latched address 'add_lat', in response to the enabled latch control signal 'latc'. Accordingly, during the interval when the input address 'add_in' needs to be transferred to the core circuit region via the address buffer 10 and the address latch unit 40 as the latched address 'add_lat', the input address 'add_in' can be adequately provided to the core circuit.

Figure 2:
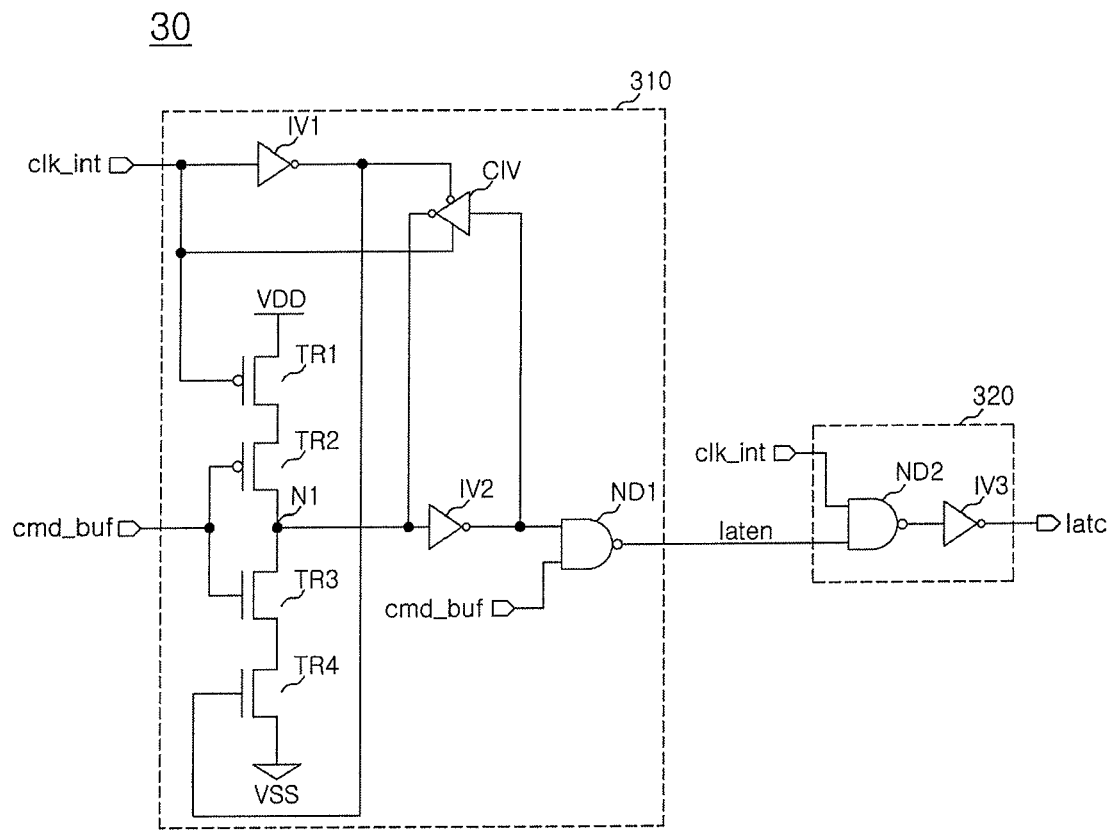
FIG. 2 is a detailed diagram showing a configuration of an embodiment of a latch control unit of FIG. 1.

FIG. 2 is a detailed diagram showing a configuration of an embodiment of a latch control unit 30 of FIG. 1.

As shown in FIG. 2, the latch control unit 30 includes: an interval determination unit 310 configured to combine the internal clock signal 'clk_int' and the buffered command 'cmd_buf' to generate a latch enable signal 'laten'; and a signal sampling unit 320 configured to sample the internal clock signal 'clk_int' during the enable interval of the latch enable signal 'laten' to generate the latch control signal 'latc'.

The interval determination unit 310 includes: a first inverter IV1 configured to receive the internal clock signal 'clk_int'; a first transistor TR1 configured to have a gate to receive the internal clock signal 'clk_int', a source to which an external power supply voltage VDD is applied; a second transistor TR2 configured to have a gate to receive the buffered command 'cmd_buf', a source coupled to a drain of the first transistor TR1, and a drain coupled to a first node N1; a third transistor TR3 configured to have a gate to receive the buffered command 'cmd_buf', and a drain coupled to the first node N1; a fourth transistor TR4 configured to have a gate to receive an output signal of the first inverter IV1, a drain coupled to a source of the third transistor TR3, and a source coupled to the ground; a second inverter IV2 configured to receive a voltage level of the first node N1; a control inverter CIV configured to be coupled to the second inverter IV2 in a latch configuration and operate in response to controls of the internal clock signal 'clk_int' and the output signal of the first inverter IV1; and a first NAND gate ND1 configured to receive the buffered command 'cmd_buf' and an output signal of the second inverter IV2 to generate the latch enable signal 'laten'. The first and second transistors TR1 and TR2 are preferably PMOS transistors, whereas the third and fourth transistors TR3 and TR4 are preferably NMOS transistors.

In addition, the signal sampling unit 320 includes: a second NAND gate ND2 configured to receive the internal clock signal 'clk_int' and the latch enable signal 'laten'; and a third inverter IV3 configured to receive an output signal of the second NAND gate ND2 to output the latch control signal 'latc'.

In such a configuration, an operation of the latch control unit 30 will now be described in more detail with reference to FIG. 3.

Figure 3:
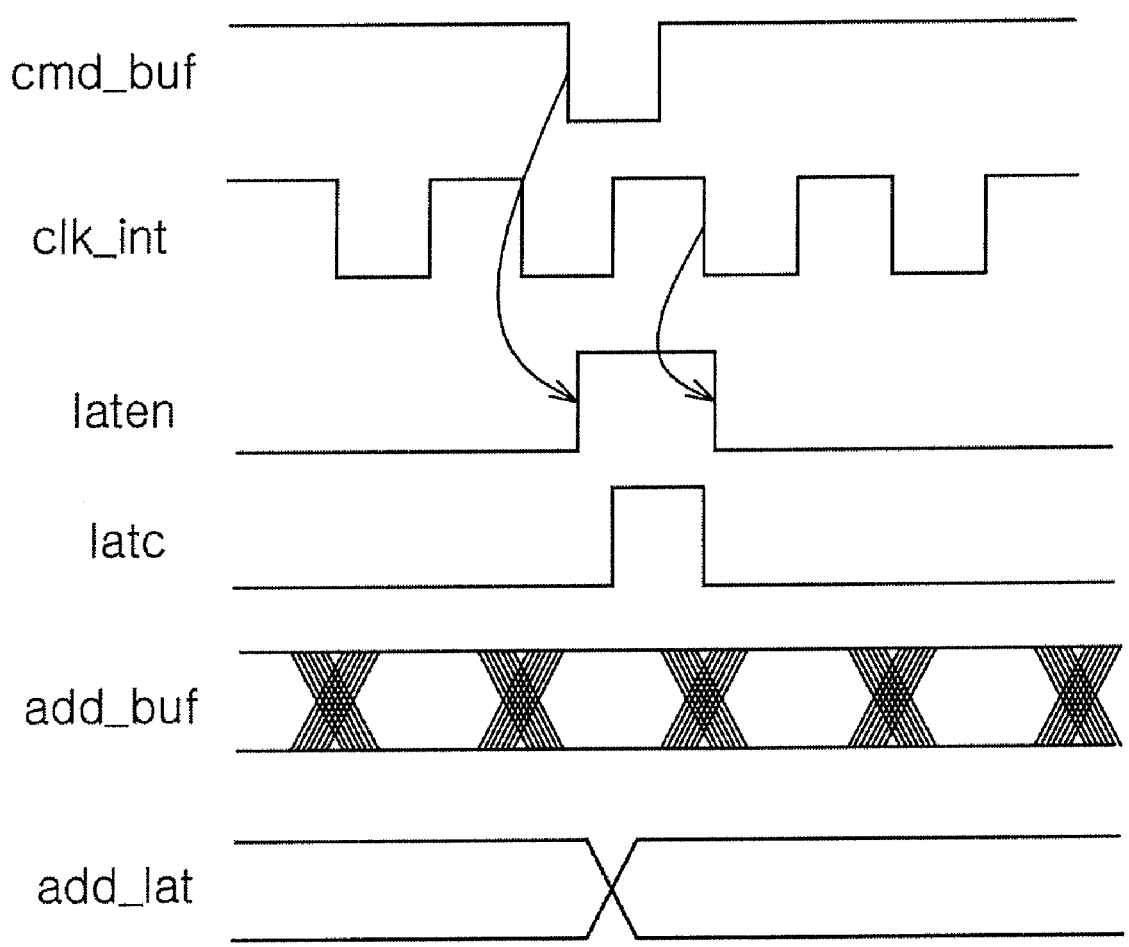
FIG. 3 is a timing diagram showing an operation of a semiconductor memory apparatus according to the embodiment of the present invention.

FIG. 3 is a timing diagram showing an operation of the semiconductor memory apparatus according to the embodiment.

In FIG. 3, waveforms of the buffered command 'cmd_buf', the internal clock signal 'clk_int', the latch enable signal 'laten', the latch control signal 'latc', the buffered address 'add_buf', and the latched address 'add_lat' are shown.

Since the chip selection command '/CS', in general, is implemented as a low enable signal, the buffered command 'cmd_buf' is represented as a low enable signal as well, in FIG. 3.

Referring to FIG. 2, when the voltage level of the buffered command 'cmd_buf' is at a logic high level and the voltage level of the internal clock signal 'clk_int' is at a logic low level, a voltage level of the output signal of the second inverter IV2 is at a logic high level. Therefore, a voltage level of the latch enable signal 'laten' outputted from the first NAND gate ND1 is at a logic low level.

In the state where the voltage level of the internal clock signal 'clk_int' is at the logic low level, if the voltage level of the buffered command 'cmd_buf' changes to a logic low level, the voltage level of the output signal of the second inverter IV2 changes to a logic low level. At this time, since the first NAND gate ND1 receives the low level signals, the voltage level of the latch enable signal 'laten' changes to a logic high level.

Afterwards, in the state where the voltage level of the buffered command 'cmd_buf' is at the logic low level, even when the voltage level of the internal clock signal 'clk_int' changes to a logic high level, the voltage levels of signals inputted to the first NAND gate ND1 are not changed. Therefore, at this time, the voltage level of the latch enable signal 'laten' is substantially maintained at the logic high level.

In this state, even when the voltage level of the buffered command 'cmd_buf' changes to the logic high level, the output signal of the second inverter IV2 has the voltage level of the logic low level due to the latch configuration that the second inverter IV2 and the control inverter CIV constitute. Therefore, the voltage level of the latch enable signal 'laten' is substantially maintained at the logic high level.

However, afterwards, in the state where the voltage level of the buffered command 'cmd_buf' is at the logic high level, if the voltage level of the internal clock signal 'clk_int' changes to the logic low level, the output signal of the second inverter IV2 changes to the logic high level, and subsequently the first NAND gate ND1 receives the high level signals. Therefore, at this time, the latch enable signal 'laten' changes to the logic low level.

That is, the interval determination unit 310 enables the latch enable signal 'laten', from the timing when the buffered command 'cmd_buf' is enabled to the timing when the voltage level of the internal clock signal 'clk_int' changes to the logic low level. Such an operation of the interval determination unit 310 is performed to completely sample a high level interval of the internal clock signal 'clk_int' when the signal sampling unit 320 performs a logic AND operation on the internal clock signal 'clk_int' and the latch enable signal 'laten'.

With reference to FIG. 3, it will be readily understood that, among the plurality of buffered addresses 'add_buf' inputted in serial, the address latch unit 40 latches only one address to generate the latched address 'add_lat', in synchronization with the latch control signal 'latc'.

As described above, the semiconductor memory apparatus 1 according to the embodiment includes a circuit unit configured to buffer and latch the input address to transfer the latched address to the core circuit region as the latched address if the chip selection command is enabled, and stop the operation that generates the latched address by using the input address if the chip selection command is not enabled. And, by using the circuit unit, the semiconductor memory apparatus 1 according to the embodiment enables the address latch operation only during the interval when the address needs to be provided to the core circuit, and disables the address latch operation during the interval when the address does not need to be provided to the core circuit. Therefore, the semiconductor memory apparatus 1 according to the embodiment substantially reduces the current consumption of the address latch unit during the interval when the address latch operation is unnecessary, thereby improving power efficiency of the semiconductor memory apparatus 1.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A semiconductor memory apparatus comprising:
    an address buffer configured to buffer an input address and generate a buffered address;
    a command buffer configured to buffer a chip selection command and generate a buffered command;
    a latch control unit configured to receive an internal clock signal and the buffered command and generate a latch control signal; and
    an address latch unit configured to latch the buffered address based on the latch control signal.

2. The semiconductor memory apparatus of claim 1, wherein the address buffer is configured to sequentially buffer each bit of the input address inputted in serial and generate the buffered address.

3. The semiconductor memory apparatus of claim 1, wherein the latch control unit is configured to generate the latch control signal in a pulse signal form which has an enable interval with a substantially same duration as a high level interval of the internal clock signal.

4. The semiconductor memory apparatus of claim 1, wherein the latch control unit comprises:
    an interval determination unit configured to receive the internal clock signal and the buffered command and generate a latch enable signal; and
    a signal sampling unit configured to sample the internal clock signal during an enable interval of the latch enable signal and generate the latch control signal.

5. The semiconductor memory apparatus of claim 1, wherein the address latch unit is configured to latch the buffered address in synchronization with the latch control signal, and be disabled during a disable interval of the latch control signal.

6. A semiconductor memory apparatus comprising:
    a circuit unit configured to buffer and latch an input address to generate a latched address and transfer the latched address to a core circuit region when a chip selection command is enabled, and not to generate the latched address when the chip selection command is not enabled.

7. The semiconductor memory apparatus of claim 6, wherein the circuit unit comprises:
    an address buffer configured to buffer the input address and generate a buffered address;
    a command buffer configured to buffer the chip selection command and generate a buffered command;
    a latch control unit configured to receive an internal clock signal and the buffered command and generate a latch control signal; and
    an address latch unit configured to latch the buffered address and generate the latched address, based on the latch control signal.

8. The semiconductor memory apparatus of claim 7, wherein the latch control unit is configured to generate the latch control signal in a pulse signal form which has an enable interval with a substantially same duration as a high level interval of the internal clock signal.

9. The semiconductor memory apparatus of claim 7, wherein the address latch unit is configured to latch the buffered address in synchronization with the latch control signal and generate the latched address, and be disabled during a disable interval of the latch control signal.

10. A method of controlling a semiconductor memory apparatus comprising:
    detecting a disable state of a chip selection command to disable a latch control signal;
    disabling a latch operation on a buffered address based on the disabled latch control signal;
    detecting an enable state of the chip selection command to enable the latch control signal; and
    enabling the latch operation on the buffered address based on the enabled latch control signal.

11. The method of claim 10, wherein the buffered address is configured to be generated by using an address buffer and sequentially buffering each bit of the input address inputted in serial.

12. The method of claim 10, wherein enabling the latch control signal comprises:
    buffering the chip selection command to generate a buffered command; and
    receiving an internal clock signal and the buffered command to generate the latch control signal.

13. The method of claim 12, wherein generating the latch control signal comprises generating the latch control signal in a pulse signal form which has an enable interval with a substantially same duration as a high level interval of the internal clock signal.

* * * * *